(12) United States Patent
Uchikawa et al.

(10) Patent No.: US 8,149,623 B2
(45) Date of Patent: Apr. 3, 2012

(54) CONTROLLER AND NON-VOLATILE SEMICONDUCTOR MEMORY DEVICE

(75) Inventors: Hironori Uchikawa, Fujisawa (JP); Kenji Sakurada, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 240 days.

(21) Appl. No.: 12/715,772

(22) Filed: Mar. 2, 2010

(65) Prior Publication Data

US 2011/0038212 A1 Feb. 17, 2011

(30) Foreign Application Priority Data

Aug. 13, 2009 (JP) ................................. 2009-187827

(51) Int. Cl.
G11C 16/04 (2006.01)
(52) U.S. Cl. .......... 365/185.18; 365/185.24; 365/189.07
(58) Field of Classification Search ............. 365/185.18, 365/185.2, 185.24, 189.07, 189.15
See application file for complete search history.

(56) References Cited

U.S. PATENT DOCUMENTS

| | | | |
|---|---|---|---|
| 6,850,252 B1 * | 2/2005 | Hoffberg | ...................... 715/716 |
| 7,508,704 B2 | 3/2009 | Honma et al. | |
| 2007/0053513 A1 * | 3/2007 | Hoffberg | ...................... 380/201 |
| 2008/0263266 A1 | 10/2008 | Sharon et al. | |
| 2009/0201726 A1 | 8/2009 | Honma et al. | |
| 2010/0199149 A1 * | 8/2010 | Weingarten et al. | .......... 714/773 |

FOREIGN PATENT DOCUMENTS

JP 2008-16092 1/2008

OTHER PUBLICATIONS

U.S. Appl. No. 12/796,211, filed Jun. 8, 2010, Sakurada, et al.

* cited by examiner

*Primary Examiner* — Gene Auduong
(74) *Attorney, Agent, or Firm* — Oblon, Spivak, McClelland, Maier & Neustadt, L.L.P.

(57) ABSTRACT

A controller includes a generation unit configured to aggregate comparison results between second threshold voltage levels held in the memory cells and predetermined third threshold voltage levels, and generate a histogram of the second threshold voltage levels, an estimation unit configured to estimate statistical parameter of a distribution of the second threshold voltage levels with respect to a first threshold voltage level according to writing data, based on the histogram, and a determination unit configured to determine a fifth threshold voltage level defining a boundary of a fourth threshold voltage level indicating a read result of the memory cells from the third threshold voltage levels based on the statistical parameter in such a manner that mutual information amount between the first threshold voltage level and the fourth threshold voltage level becomes maximum.

8 Claims, 2 Drawing Sheets

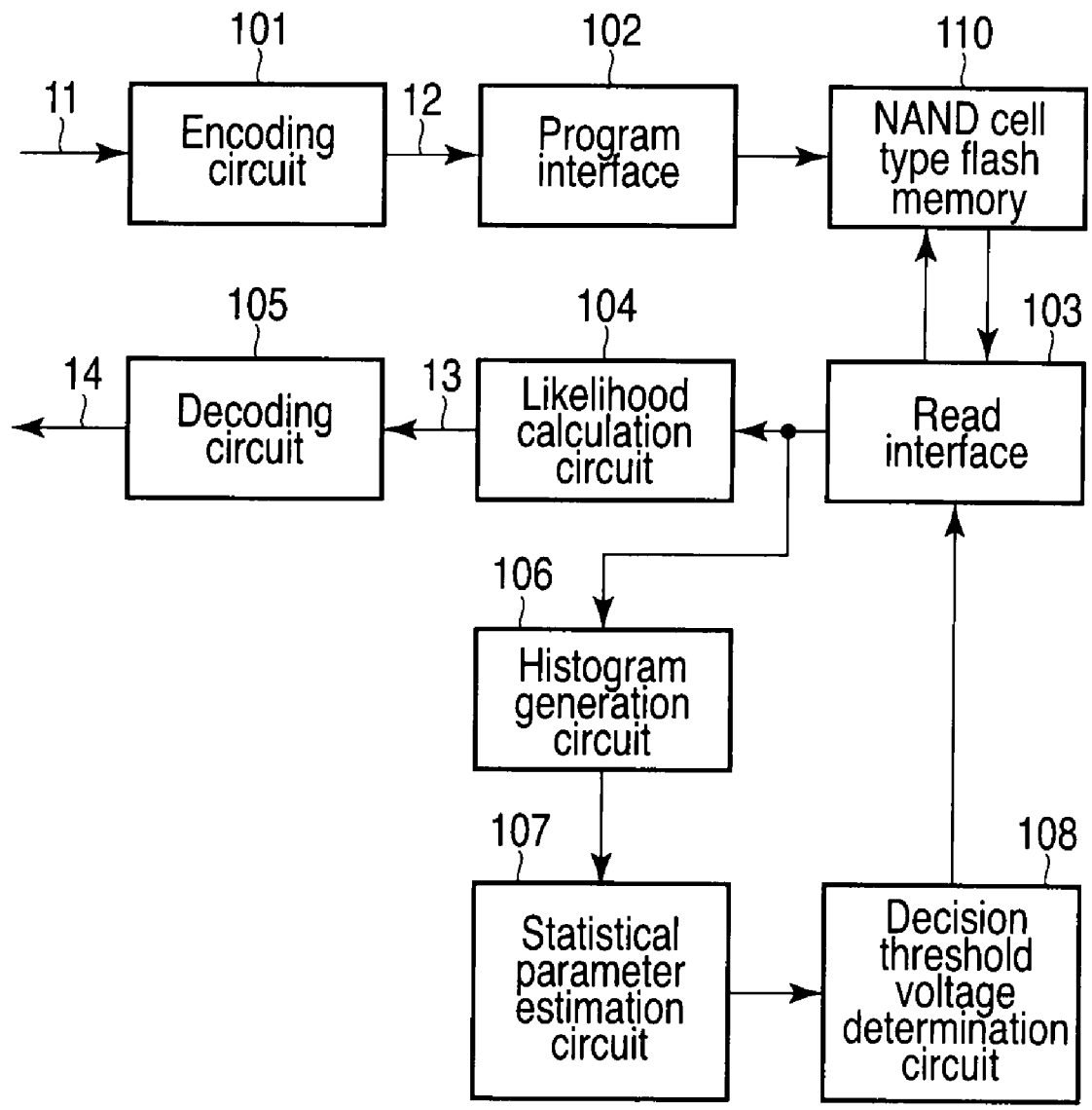
F I G. 1

US 8,149,623 B2

CONTROLLER AND NON-VOLATILE SEMICONDUCTOR MEMORY DEVICE

CROSS-REFERENCE TO RELATED APPLICATIONS

This application is based upon and claims the benefit of priority from prior Japanese Patent Application No. 2009-187827, filed Aug. 13, 2009, the entire contents of which are incorporated herein by reference.

BACKGROUND OF THE INVENTION

1. Field of the Invention

The present invention relates to a controller for a non-volatile semiconductor memory device.

2. Description of the Related Art

A NAND cell type flash memory has been conventionally known as a kind of non-volatile semiconductor memory device. Normally, the NAND cell type flash memory is provided with a plurality of blocks serving as a set of memory cells. In each of the blocks, a plurality of memory cells are arrayed. Specifically, in each of the blocks (e.g., 64 KB), the plurality of memory cells arrayed in one direction form a page (e.g., 1 KB) per which data is read, and further, a plurality of pages (e.g., 64) are arrayed in a direction perpendicular to the above-described direction. The memory cell to be read, written, erased, and the like is selected by a selecting transistor connected to a control circuit. The memory cell indicates "1" according to a threshold voltage level in an erasure state. In the meantime, in writing "0" in the memory cell, an electron is injected into a floating gate in the memory cell, thereby setting a threshold voltage level indicating "0". Incidentally, in the NAND cell type flash memory, a threshold voltage can be transited from a low level (a level indicating "1") to a high level (a level indicating "0") during writing, but not vice versa. The memory cell need be erased in a unit of the above-described block in order to transit the threshold voltage from the high level to the low level.

Information amount which can be stored in each of the memory cells is not limited to 1 bit (i.e., binary data). For example, a 4-value NAND cell type flash memory can store 4-value data (i.e., information of 2 bits) on four threshold voltage levels. Here, in general, variations are generated in a device such as an oxide film constituting the memory cell. Therefore, threshold voltage levels held by a plurality of memory cells with respect to the threshold voltage level set during writing form a distribution. Read data in the memory cell is decided by comparing a threshold voltage level held by the memory cell with a decision threshold voltage level. As a consequence, a writing threshold voltage level corresponding to a data pattern is set so as to prevent any overlap of the distributions between the adjacent threshold voltage levels. The decision threshold voltage level is set such that the overlap of the distributions between the adjacent writing threshold voltage levels becomes minimum. However, as information amount which can be stored in the memory cell increases (multivalent), an interval between the writing threshold voltage levels for representing each of the pieces of information becomes narrower, thereby increasing a possibility of occurrence of the overlap of the distributions between the adjacent writing threshold voltage levels. In addition, when an electric charge leaks from the floating gate due to a secular change in the memory cell or the oxide film is fatigued due to repetitive writing, erasing, and the like, the distribution of the threshold voltage levels is varied. That is to say, even if a decision threshold voltage level is optimum at certain timing, it may not be optimum at another timing.

US 2008/0263266 discloses a reading method for a flash memory, in which decision threshold voltage levels are widely inched, to produce a histogram of a threshold voltage level held in each of the memory cells. In the reading method, one decision threshold voltage level capable of minimizing a reading error out of settable decision threshold voltage levels is estimated based on the histogram.

In contrast, it is becoming difficult for a NAND cell type flash memory to maintain reliability (error resistance) to an extent equal to that of an old generation caused by evolution of generation such as a multivalue or a process. As a consequence, an error correcting code (e.g., a Low Density Parity Check (LDPC) code) having a high error correction capability for soft decision decoding is desirable rather than an error correcting code (e.g., a BCH code) for hard decision decoding, like a non-volatile semiconductor memory system disclosed in JP-A 2008-16092 (KOKAI).

In order to perform the soft decision decoding, it is necessary to set more decision threshold voltage levels than those in the case where the hard decision decoding is performed. For example, when the hard decision decoding is performed in reading a 4-value NAND cell type flash memory, a decision may be made on four levels by decision threshold voltages on three stages. In contrast, when the soft decision decoding is performed in the 4-value NAND cell type flash memory, a decision need be made on 8 or 16 levels by decision threshold voltages on 7 or 15 stages.

Like the non-volatile semiconductor memory system disclosed in JP-A 2008-16092 (KOKAI), it is not sufficient from the viewpoint of minimization of a decoding error in the soft decision decoding to set the decision threshold voltage levels for the soft decision decoding in such a manner as to equally divide the decision threshold voltage level for the hard decision decoding.

BRIEF SUMMARY OF THE INVENTION

According to an aspect of the invention, there is provided a controller comprising: a program interface configured to set a first threshold voltage level according to writing data in memory cells; a generation unit configured to aggregate comparison results between second threshold voltage levels held in the memory cells and predetermined third threshold voltage levels, and generate a histogram of the second threshold voltage levels; an estimation unit configured to estimate statistical parameter of a distribution of the second threshold voltage levels with respect to the first threshold voltage level based on the histogram; a determination unit configured to determine a fifth threshold voltage level defining a boundary of a fourth threshold voltage level indicating a read result of the memory cells from the third threshold voltage levels based on the statistical parameter in such a manner that mutual information amount between the first threshold voltage level and the fourth threshold voltage level becomes maximum; and a read interface configured to cause each of the memory cells to compare the second threshold voltage level with the fifth threshold voltage level, and obtain the fourth threshold voltage level according to a comparison result.

According to another aspect of the invention, there is provided a non-volatile semiconductor memory device, comprising: a NAND memory which includes memory cells; a program interface configured to set a first threshold voltage level according to writing data in the memory cells; a generation unit configured to aggregate comparison results between second threshold voltage levels held in the memory cells and predetermined third threshold voltage levels, and generate a histogram of the second threshold voltage levels; an estimation unit configured to estimate statistical parameter of a distribution of the second threshold voltage levels with respect to the first threshold voltage level based on the histogram; a determination unit configured to determine a fifth threshold voltage level defining a boundary of a fourth threshold voltage level indicating a read result of the memory cells from the third threshold voltage levels based on the statistical parameter in such a manner that mutual information amount between the first threshold voltage level and the fourth threshold voltage level becomes maximum; and a read interface configured to cause each of the memory cells to compare the second threshold voltage level with the fifth threshold voltage level, and obtain the fourth threshold voltage level according to a comparison result.

BRIEF DESCRIPTION OF THE SEVERAL VIEWS OF THE DRAWING

FIG. 1 is block diagram illustrating a controller according to a first embodiment.

DETAILED DESCRIPTION OF THE INVENTION

Figure 2:
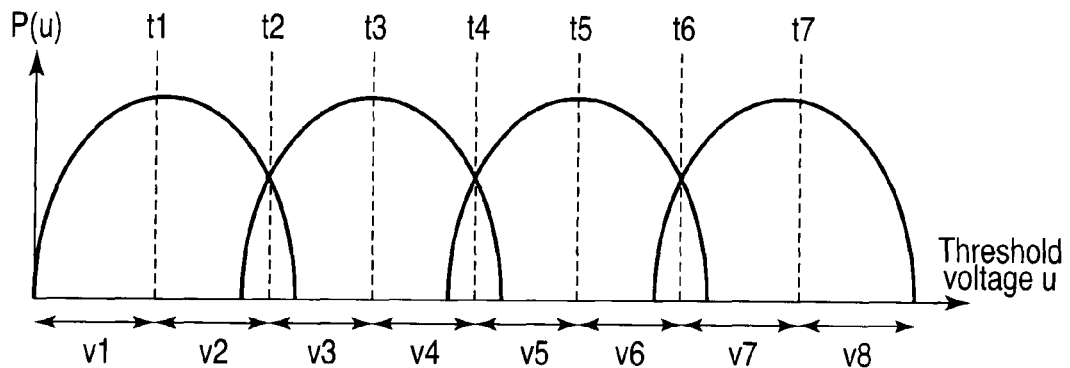
FIG. 2 is a graph illustrating an example in which a decision threshold voltage levels are set.

A detailed description will be given below of embodiments of the present invention with reference to the attached drawings.
(First Embodiment)
A controller according to a first embodiment of the present invention comprises an encoding circuit 101, a program interface 102, a read interface 103, a likelihood calculation circuit 104, a decoding circuit 105, a histogram generation circuit 106, a statistical parameter estimation circuit 107, and a decision threshold voltage determination circuit 108, as illustrated in FIG. 1. The controller performs normal control processing such as writing, reading, erasing, and the like in a NAND cell type flash memory 110. Moreover, the controller can set a decision threshold voltage level with respect to the NAND cell type flash memory 110.

The encoding circuit 101 receives user data 11 to be written, from a processor, not illustrated. And then, the encoding circuit 101 adds parity data based on a predetermined error correcting code (e.g., an LDPC code) to the user data 11, thereby producing ECC (Error Checking and Correction) data 12. Thereafter, the encoding circuit 101 inputs the ECC data 12 into the program interface 102.

The program interface 102 converts the ECC data 12 into sequence s_1, . . . , and s_n (wherein n represents the number of memory cells to be used in storing one frame of the ECC data 12 which is simply referred to as an ECC frame), and then, performs program processing with respect to the NAND cell type flash memory 110. In general, the number L of writing threshold voltage levels (wherein L is a natural number of 2 or more) is a power of 2. In other words, the program interface 102 converts the ECC data 12 into a sequence of a bit unit expressed by an index (log 2(L)) of the number L of writing threshold voltage levels. For example, the program interface 102 converts the ECC data into a sequence of a unit of 2 bits when the NAND cell type flash memory 110 is a 4-value NAND cell type flash memory, or into a sequence of a unit of 3 bits when the NAND cell type flash memory 110 is an 8-value NAND cell type flash memory. Thereafter, the program interface 102 inputs a command for setting the sequence s_1, . . . , and s_n of the writing threshold voltage levels in n memory cells, respectively, into the NAND cell type flash memory 110. Here, when each of the memory cells can store a plurality of bits, all of the plurality of bits may be assigned to one and the same ECC frame, as described above, or may be assigned to a plurality of ECC frames in dispersion (for example, one bit to one ECC frame).

Each of the memory cells in the NAND cell type flash memory 110 holds a writing threshold voltage level set in accordance with a command of the program processing from the program interface 102. In the meantime, the NAND cell type flash memory 110 compares a decision threshold voltage level designated in accordance with a command of reading processing from the read interface 103 with the threshold voltage level (i.e., a second threshold voltage level) held in each of the memory cells, and thus, returns a comparison result (High or Low).

The read interface 103 inputs the above-described command of the reading processing with respect to a group of memory cells continuous to an arbitrary address into the NAND cell type flash memory 110 by using a decision threshold voltage level (a third threshold voltage level or a fifth threshold voltage level) input from the decision threshold voltage determination circuit 108. And then, the read interface 103 acquires a reading threshold voltage level (a fourth threshold voltage level) representing a reading result of each of the memory cells according to the above-described comparison result. Thereafter, the read interface 103 inputs the reading threshold voltage level into the likelihood calculation circuit 104 and the histogram generation circuit 106. At a time other than an operational timing of the histogram generation circuit 106 to be described later, the reading threshold voltage level may not be input into the histogram generation circuit 106. Here, M denotes the number of reading threshold voltage levels (wherein M is a natural number of L or more), reading when M is equal to L corresponds to a hard decision whereas reading when M is more than L corresponds to a soft decision. The decision threshold voltage level (the fifth threshold voltage level) defines the boundary of the reading threshold voltage levels, and therefore, it becomes M−1. The controller in the present embodiment is suitable for determining the decision threshold voltage levels for the soft decision, and alternatively, it may determine the decision threshold voltage level for the hard decision.

The likelihood calculation circuit 104 calculates logarithm likelihood ratio (LLR) data 13 representing the likelihood of each of bits stored in each of the memory cells based on the reading threshold voltage level of each of the memory cells from the read interface 103. And then, the likelihood calculation circuit 104 inputs the LLR data 13 into the decoding circuit 105. Here, the LLR data calculated by the likelihood calculation circuit 104 is a logarithmic value (natural logarithm) of a ratio of a probability p(x=0) where the bit is "0" to a probability p(x=1) where the bit is "1", and is expressed by the following expression (1):

$$\log\left(\frac{p(x=0)}{p(x=1)}\right) \quad (1)$$

The decoding circuit 105 subjects the LLR data 13 to error correcting decoding (the soft decision decoding or the hard decision decoding) per ECC frame, and then, restores the user data 14 to be read. And then, the decoding circuit 105 outputs the user data 14 to the processor, not illustrated. The histogram generation circuit 106 generates a histogram of the threshold voltage level held in each of the memory cells based on the reading threshold voltage level from the read interface 103. Specifically, the read interface 103 designates the plurality of threshold voltage levels (the third threshold voltage levels) as decision threshold voltage levels according to the level number Q of the histogram, thus to input a command of reading processing to the NAND cell type flash memory 110 in order to generate the histogram. Thereafter, the histogram generation circuit 106 generates a histogram based on the comparison result between the plurality of threshold voltage levels for generating the histogram and the threshold voltage level held in each of the memory cells. Here, the number of decision threshold voltage levels designated by the read interface 103 for generating the histogram may be Q−1 or less than Q−1. The level number Q of the histogram generated by the histogram generation circuit 106 should be desirably the number M of reading threshold voltage levels or more.

Although the memory cell whose histogram is to be generated is arbitrary, a preferred example will be introduced below.

One arbitrary page in each of the blocks in the NAND cell type flash memory 110 may become a representative page of the block whose histogram is to be generated. The distribution of the threshold voltage levels is varied in the memory cell in the NAND cell type flash memory 110 when a fatigue occurs on an oxide film due to repetitive writing or erasing. In particular, since erasing is performed per block, there is a high possibility that the distributions of the threshold voltage levels become similar to each other between pages in one and the same block whereas the distributions of the threshold voltage levels do not become similar to each other between the different blocks. As a consequence, if the one arbitrary page in each of the blocks becomes the representative page whose histogram is to be generated, a proper histogram can be generated while reducing the processing amount. Moreover, histograms may be generated with respect to all of the memory cells inside of the page or some of the memory cells inside of the page.

The histogram may not be generated over the entire region of the reading threshold voltage levels. As described later, if a part of the decision threshold voltage levels are updated, only a histogram around the decision threshold voltage level to be updated may be generated.

The statistical parameter estimation circuit 107 estimates a statistical parameter of the distribution of the threshold voltage level held in each of the memory cells in the NAND cell type flash memory 110 with respect to each of the writing threshold voltage levels based on the histogram generated by the histogram generation circuit 106. Specifically, the statistical parameter estimation circuit 107 models the distribution of the threshold voltage level held in each of the memory cells in the NAND cell type flash memory 110 with respect to each of the writing threshold voltage levels, and then, estimates a statistical parameter for representing the resultant distribution model. For example, the statistical parameter estimation circuit 107 models the distribution of the threshold voltage levels based on Gaussian distribution. In this case, a distribution model p(u|sl) of a threshold voltage level u held in each of the memory cells having an arbitrary writing threshold voltage level sl set therein is expressed by the following expression (2):

$$p(u \mid s_1) = \frac{1}{\sqrt{2\pi\sigma_1}} \exp\left(\frac{-(u-\mu_1)^2}{2\sigma_1^2}\right) \quad (2)$$

In the expression (2), ul represents an average of u, and further, σl represents a dispersion of u. The distribution model p(u|sl) expressed by the expression (2) is characterized by the average ul and the dispersion σl of u, and therefore, the statistical parameter estimation circuit 107 calculates these values as statistical parameters based on the histogram. Here, if data in the memory cell is unknown, a parameter need be estimated by using EM (Expectation Maximization) algorithm.

Incidentally, the distribution model utilized by the statistical parameter estimation circuit 107 for modeling the distribution of the threshold voltage levels is not limited to a symmetric single probability density function such as a Gaussian distribution or a Laplace distribution. For example, the statistical parameter estimation circuit 107 may utilize an asymmetric single probability density function or a mixed distribution model. A specific statistical parameter estimated by the statistical parameter estimation circuit 107 depends upon the distribution model of the threshold voltage levels. The decision threshold voltage determination circuit 108 determines a decision threshold voltage level based on the statistical parameter output from the statistical parameter estimation circuit 107. In other words, the decision threshold voltage determination circuit 108 determines M−1 decision threshold voltage levels to the maximum from the Q−1 threshold voltage levels to the maximum for the above-described histogram generation. More specifically, the decision threshold voltage determination circuit 108 determines the decision threshold voltage levels in such a manner as to maximize a mutual information amount I(S;V) between a writing threshold voltage level S and a reading threshold voltage level V. Thereafter, the decision threshold voltage determination circuit 108 inputs the determined decision threshold voltage level into the read interface 103.

The decision threshold voltage determination circuit 108 may determine the decision threshold voltage level by performing, for example, an information bottleneck method. Hereinafter, the information bottleneck method will be described in brief. Incidentally, the information bottleneck method is explained in detail in the following Literature: N. Tishby and two others, "The Information Bottleneck Method," Proc. of The 37th Annual Allerton Conference on Communications, Control and Computing. The information bottleneck method is one kind of clustering algorithm. Specifically, according to the information bottleneck method, when information X, information Y relevant to the information X, and compressed information C of the information Y are given, a conditional probability p(C|Y) for decreasing mutual information amount I(Y;C) between the information Y and the compressed information C in order to enhance compression efficiency whereas increasing mutual information amount I(X;C) between the information X and the compressed information C is determined. In this embodiment, the information X corresponds to the writing threshold voltage level S; the relevant information Y, to the threshold voltage level U held in each of the memory cells; and the compressed information C, to the reading threshold voltage level V. That is to say, the performance of the information bottleneck method in the present embodiment is equivalent to the determination of a conditional probability p(V|U) for decreasing mutual information amount I(U;V) between the threshold voltage levels U and the reading threshold voltage level V whereas increasing mutual information amount I(S;V) between the writing threshold voltage level S and the reading threshold voltage level V. Here, the information bottleneck method is repetitive algorithm, and is achieved by performing the following expressions (3) to (5) arbitrary number of times:

$$p_i(V|U) = \frac{p_i(V)}{Z_i(U,\beta)} \cdot \exp\left(-\beta \sum_S p(S|U) \log\left(\frac{p(S|V)}{p_i(S|V)}\right)\right) \quad (3)$$

$$p_{i+1}(V) = \sum_U p(U) p_i(V|U) \quad (4)$$

$$p_{i+1}(S|V) = \sum_U p(U|S) p_i(S|V) \quad (5)$$

In expressions (3) to (5), i represents the number of repetitive times of the information bottleneck method; Zi, a normalization coefficient; and β, a weighting factor which can be arbitrarily set by a user. Based on an experiment result, it is preferable that β should be about 10 to 50 whereas i should be at least 20 or more. An initial value of a conditional probability distribution p(V|U) may be uniform distribution or random distribution. In addition, a plurality of conditional probability distributions pl(V|U), . . . , and pi(V|U) may be derived from different initial values of the conditional probability distribution p(V|U), and then, a conditional probability distribution for maximizing the mutual information amount I(S; V) may be selected from the plurality of conditional probability distributions.

Next, explanation will be made on operational timings of the histogram generation circuit 106, the statistical parameter estimation circuit 107, and the decision threshold voltage determination circuit 108. These circuits may be operated for initializing a part or all of the decision threshold voltage levels in first reading the NAND cell type flash memory.

Alternatively, these circuits may be operated for updating a part or all of the decision threshold voltage levels, for example, during occurrence of a reading error or at the time of predetermined updating. In particular, the distribution of the threshold voltage level held in each of the memory cells can be conspicuously shifted, deformed, or the like with respect to a part of the decision threshold voltage levels (e.g., a relatively high writing threshold voltage level). Therefore, in such a case, the processing amount can be reduced by partly updating the decision threshold voltage level.

Hereinafter, a description will be given of the technical significance of the decision threshold voltage level determined by the controller in the present embodiment with reference to FIGS. 2 and 3.

FIG. 2 illustrates a distribution P(u) of a threshold voltage level u held in each of the memory cells inside of the 4-value NAND cell type flash memory and seven decision threshold voltage levels t1, . . . , and t7 determined by a conventional technique. Specifically, referring to FIG. 2, points of intersection between distributions P(u) based on adjacent writing threshold voltage levels are set to decision threshold voltage levels t2, t4, and t6. Moreover, a middle point between a minimum value of the threshold voltage level u and the decision threshold voltage level t2 is set to a decision threshold voltage level t1; a middle point between the decision threshold voltage level t2 and the decision threshold voltage level t4 is set to a decision threshold voltage level t3; a middle point between the decision threshold voltage level t4 and the decision threshold voltage level t6 is set to a decision threshold voltage level t5; and a middle point between the decision threshold voltage level t6 and a maximum value of the threshold voltage level u is set to a decision threshold voltage level t7, respectively.

Figure 3:
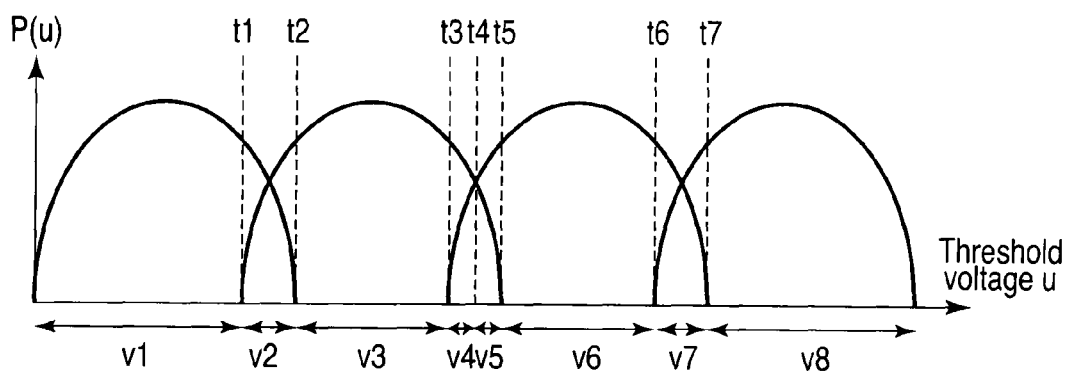
FIG. 3 is a graph illustrating decision threshold voltage levels to be determined by a decision threshold voltage determining circuit illustrated in FIG. 1.

On the other hand, FIG. 3 illustrates an example in which the decision threshold voltage determination circuit 108 determines the seven decision threshold voltage levels t1, . . . , and t7 illustrated in FIG. 2. Specifically, referring to FIG. 3, the seven decision threshold voltage levels t1, . . . , and t7 are determined such that the mutual information amount I(S;V) between the writing threshold voltage level S and the reading threshold voltage level V becomes maximum. As is obvious from FIG. 3, the decision threshold voltage levels determined by the decision threshold voltage determination circuit 108 are concentrated in an area in which the distributions overlap. A decoding error is liable to occur in the area in which the distributions overlap. In view of this, the concentration of the decision threshold voltage levels in the area in which distributions overlap can reduce a reading error.

As described above, the controller according to the present embodiment determines the decision threshold voltage level in such a manner as to maximize the mutual information amount between the writing threshold voltage level and the reading threshold voltage level. As a consequence, the controller according to the present embodiment can concentrate the decision threshold voltage level in the range in which a decoding error is liable to occur, thus reducing a reading error. Consequently, the controller according to the present embodiment can enhance reading reliability in a non-volatile semiconductor memory device (such as the NAND cell type flash memory).

(Second Embodiment)

A controller according to a second embodiment of the present invention is different from the controller according to the above-described first embodiment in a part of operation by the histogram generation circuit. A description will be mainly given of the difference between a histogram generation circuit 206 according to the present embodiment and the histogram generation circuit 106 according to the first embodiment.

In the first embodiment, the read interface 103 need designate the Q−1 threshold voltage levels to the maximum so as to input a reading command into the NAND cell type flash memory 110 such that the histogram generation circuit 106 generates the histogram of the maximum Q levels. Since a time required for reading is increased as the number of threshold voltage levels is increased, the number of threshold voltage levels for generating the histogram may become an obstacle to an increase in speed during initializing, updating, or the like.

Figure 4:
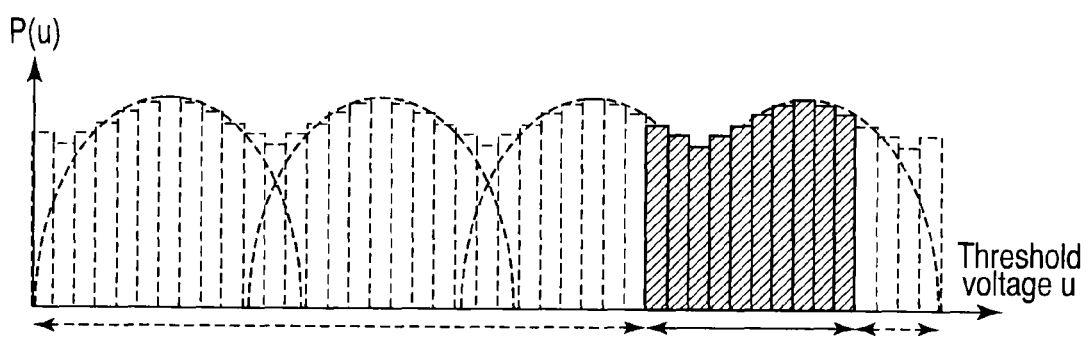
FIG. 4 is a graph illustrating operation of a histogram generation circuit according to a second embodiment.

In view of the above, in the present embodiment, the histogram generation circuit 206 generates a histogram of R levels less than Q, and interpolatively generates a histogram of Q levels to the maximum by duplicating the histogram of the R levels. The histogram generation circuit 206 generates the histogram of the R levels (see a hatched portion in FIG. 4), and then, repetitively duplicates the histogram of the R levels, and thus, interpolatively generates the histogram of the Q levels to the maximum, as illustrated in, for example, FIG. 4. The number of threshold voltage levels required for generating the histogram of the R levels is at most R+1. In other words, the histogram generation circuit 206 can interpolatively generate the histogram in a desired range by duplicating the generated histogram while reducing the number of threshold voltage levels required for generating the histogram. Although the number R of levels is arbitrary, it is desirable that the number should cover a distribution based on at least one writing threshold voltage level.

As described above, the histogram generation circuit in the controller in the present embodiment generates only a part of the histograms within the desired range, duplicates the generated part of the histograms, and thus, interpolatively generates the residual histograms. Consequently, the controller in the present embodiment can reduce the processing amount of the histogram generation, resulting in the determination of the decision threshold voltage level (such as initializing, updating, or the like), like in the above-described first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A controller comprising:
    a program interface configured to set a first threshold voltage level according to writing data in memory cells;
    a generation unit configured to aggregate comparison results between second threshold voltage levels held in the memory cells and predetermined third threshold voltage levels, and generate a histogram of the second threshold voltage levels;
    an estimation unit configured to estimate statistical parameter of a distribution of the second threshold voltage levels with respect to the first threshold voltage level based on the histogram;
    a determination unit configured to determine a fifth threshold voltage level defining a boundary of a fourth threshold voltage level indicating a read result of the memory cells from the third threshold voltage levels based on the statistical parameter in such a manner that mutual information amount between the first threshold voltage level and the fourth threshold voltage level becomes maximum; and
    a read interface configured to cause each of the memory cells to compare the second threshold voltage level with the fifth threshold voltage level, and obtain the fourth threshold voltage level according to a comparison result.

2. The controller according to claim 1, wherein the determination unit performs an information bottleneck method to calculate a conditional probability distribution of the fourth threshold voltage level on the condition of the second threshold voltage levels, and determines the fifth threshold voltage level from the third threshold voltage levels based on the conditional probability distribution.

3. The controller according to claim 2, wherein the determination unit sets different initial values to calculate the conditional probability distributions to perform the information bottleneck method, and determines the fifth threshold voltage level from the third threshold voltage levels based on the conditional probability distribution on which the mutual information amount becomes maximum.

4. The controller according to claim 1, wherein the generation unit aggregates comparison results between the second threshold voltage levels and a part of the third threshold voltage levels to generate a part of the histogram, and duplicates the part of the histogram to interpolatively generate a residual histogram.

5. A non-volatile semiconductor memory device, comprising:
    a NAND memory which includes memory cells;
    a program interface configured to set a first threshold voltage level according to writing data in the memory cells;
    a generation unit configured to aggregate comparison results between second threshold voltage levels held in the memory cells and predetermined third threshold voltage levels, and generate a histogram of the second threshold voltage levels;
    an estimation unit configured to estimate statistical parameter of a distribution of the second threshold voltage levels with respect to the first threshold voltage level based on the histogram;
    a determination unit configured to determine a fifth threshold voltage level defining a boundary of a fourth threshold voltage level indicating a read result of the memory cells from the third threshold voltage levels based on the statistical parameter in such a manner that mutual information amount between the first threshold voltage level and the fourth threshold voltage level becomes maximum; and
    a read interface configured to cause each of the memory cells to compare the second threshold voltage level with the fifth threshold voltage level, and obtain the fourth threshold voltage level according to a comparison result.

6. The device according to claim 5, wherein the determination unit performs an information bottleneck method to calculate a conditional probability distribution of the fourth threshold voltage level on the condition of the second threshold voltage levels, and determines the fifth threshold voltage level from the third threshold voltage levels based on the conditional probability distribution.

7. The device according to claim 6, wherein the determination unit sets different initial values to calculate the conditional probability distributions to perform the information bottleneck method, and determines the fifth threshold voltage level from the third threshold voltage levels based on the conditional probability distribution on which the mutual information amount becomes maximum.

8. The device according to claim 5, wherein the generation unit aggregates comparison results between the second threshold voltage levels and a part of the third threshold voltage levels to generate a part of the histogram, and duplicates the part of the histogram to interpolatively generate a residual histogram.

* * * * *